July 27, 1965 HUNG CHANG LIN 3,197,710

COMPLEMENTARY TRANSISTOR STRUCTURE

Filed May 31, 1963 2 Sheets-Sheet 1

WITNESSES
Theodore T. Wrobel
James F. Young

INVENTOR
Hung C. Lin
BY Gordon H. Telfer
ATTORNEY

United States Patent Office 3,197,710

Patented July 27, 1965

3,197,710

COMPLEMENTARY TRANSISTOR STRUCTURE

Hung Chang Lin, Monroeville, Pa., assignor to Westinghouse Electric Corporation, Pittsburgh, Pa., a corporation of Pennsylvania Filed May 31, 1963, Ser. No. 284,611

8 Claims. (Cl. 330—38)

This invention relates generally to semiconductor structures for the performance of transistor functions and, more particularly, to unitary structures, and methods of making such structures, which are capable of performing the functions of both an n-p-n transistor and a p-n-p transistor.

In the art of molecular electronics, the functions of a plurality of conventional circuit components such as transistors, diodes, capacitors and resistors are provided within a unitary body of semiconductive material with conductive interconnections selectively made between certain regions to provide the functions of a circuit which inherently has a high degree of reliability and other advantages over conventionally interconnected circuits. Such unitary structures are known as integrated circuits or functional electronic blocks.

In an integrated circuit a transistor structure having either n-p-n polarity or p-n-p polarity may be achieved by a variety of known techniques. However, when it is desired to fabricate an integrated circuit having both a p-n-p transistor and an n-p-n transistor difficulty is encountered because known techniques require a large number of process steps, particularly diffusion operations, requiring a high degree of control. If any one of the several diffusion operations is performed improperly an unsatisfactory device results.

At the same time it is necessary that the method employed to provide the complementary pair of transistor structures permit the desired degree of isolation between the structures within the unitary body of semiconductive material so as to minimize undesirable electrical interaction.

Some discussion of the need for complementary transistor structures and of other techniques for the fabrication of such structures may be found in an article entitled "npn/pnp Single Substrate Transistors," in Electronic News, Apr. 22, 1963, page 4.

It is, therefore, an object of the present invention to provide a unitary semiconductor structure capable of performing the functions of a complementary pair of transistors, which structure may be fabricated by a minimum number of process steps.

Another object is to provide a unitary semiconductor structure capable of performing the functions of a complementary pair of transistors with a high degree of electrical isolation within the semiconductive material so as to permit the use of such a structure in integrated circuits.

Another object is to provide improved methods for the fabrication of semiconductor structures for performing the functions of a complementary pair of transistors.

The invention in brief, achieves the foregoing and other objects by providing the functions of a transistor of one type, p-n-p for example, in a structure fabricated in a manner requiring only the process operations which are usual for a transistor of the other type, n-p-n. The structure includes a substrate, a first pair of distinct regions on the substrate which are preferably of opposite semiconductivity type thereto, a second pair of regions on one of the first pair of regions and each forming a p-n junction therewith to provide a first transistor structure whose regions are laterally disposed, another region on the other of the first pair of regions forming a p-n junction therewith and a junction forming region on that region to provide a second transistor structure of opposite polarity to the first transistor structure.

The above referred to first transistor structure, which is formed by laterally disposed regions, will not, in general, have sufficient gain to adequately perform as a transistor amplifier. Hence, in practically all applications where a complementary pair of transistor amplifiers is desired, the lateral transistor structure serves as a phase inverter and its output is amplified by the more conventionally formed transistor by the use of conductive interconnections between the emitter of the lateral transistor and the collector of the other transistor structure and between the collector of the lateral transistor and the base of the other transistor. In addition to the first two transistor structures above described there is then also provided at least a third transistor structure of the conventionally formed type which may be interconnected with the first pair in any way for use as a p-n-p–n-p-n transistor pair.

In accordance with the method of this invention there is first obtained a unitary substrate of semiconductive material on which there is formed by epitaxial growth a layer of semiconductive material preferably of opposite semiconductivity type to that of the substrate. Where, for example, the substrate is of p-type semiconductivity and the epitaxial layer is of n-type semiconductivity, an isolation wall is formed by diffusing an acceptor type impurity through the epitaxial layer to the substrate to provide discrete isolated regions of n-type material of the epitatxial layer on the surface. Then, in a single diffusion operation, two p-type regions are formed in one portion of the epitaxial layer and one p-type region is formed in another portion. That portion having the two p-type regions therein provides a first transistor structure which is a p-n-p polarity and that portion having one p-type region therein provides the second transistor structure of n-p-n polarity upon the subsequent formation by diffusion of an n-type region in the surface of the p-type region. Conductive interconnections between the p-n-p and n-p-n structures are provided so that the output of the p-n-p transistor is amplified by the n-p-n transistor. Another n-p-n structure formed in the same manner as that referred to is also provided and may be conductively interconnected in any of the known ways to perform complementary amplifier functions.

The present invention, together with the above-mentioned and additional objects and advantages thereof, will become more apparent with reference to the following description, taken in connection with the accompanying drawing, in which.

Figure 1:
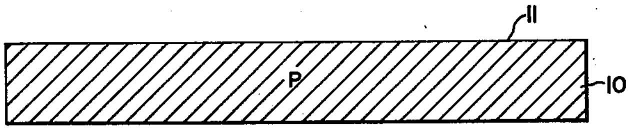
FIGURES 1 through 6 are side views, in cross section, of a semiconductor structure in accordance with this invention at various stages in the fabrication process.

Referring to FIG. 1, a suitable starting material or substrate 10 for the practice of this invention is shown. The starting material 10 is an essentially monocrystalline body of semiconductive material formed by any of the known crystal growing techniques including that taught by Patent 3,031,403 by A. I. Bennett, Jr., issued Apr. 24, 1962, for the production of dendritic crystals. The substrate 10 has a major surface 11 which is planar and has sufficient area for the subsequent fabrication of function performing regions thereon. The thickness of the substrate 10 is at least sufficient to provide the desired degree of mechanical stability in the structure.

Silicon or another semiconductor material, such as germanium or III–V compound, may be employed for the starting material 10. In the following discussion which is illustrative of the practice of this invention, it will be assumed that the starting material is of silicon since it is readily available and the individual process techniques such as epitaxial growth, oxide masking and impurity diffusion are better known for silicon than for other semiconductive materials. Also, merely by way of illustration, the substrate is designated as of p-type semiconductivity and may be doped with any of the known acceptor type impurities to provide an average resistivity of from about 1 ohm-centimeter to about 100 ohm-centimeters or more. Since the method in accordance with this invention requires the formation of a layer on the major surface of the starting material by epitaxial growth, it will be convenient for the major surface 11 to be of <111> orientation, as is readily commercially available, since the techniques for epitaxial growth on such a surface are well known and easily practiced although epitaxial growth on other surfaces may be performed. At least the major surface 11 of the starting material is degreased and chemically etched and made oxide free by any of the known techniques so as to facilitate the formation of an epitaxial layer thereon.

Figure 2:
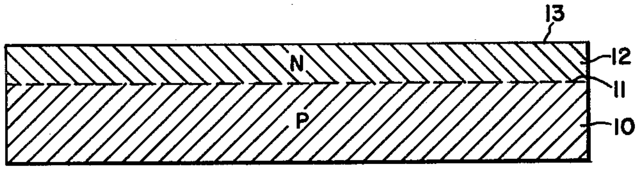

FIG. 2 shows the structure after an epitaxial layer 12 has been formed on the major surface 11 of the substrate 10. The epitaxial layer 12 is a monocrystalline extension of the substrate 10 and may, in general, be formed by the thermal decomposition of a compound of the semiconductive material such as the reduction of silicon tetrachloride by hydrogen at a temperature of about 1200° C.

A doping impurity is supplied with the gaseous reactants to provide the desired type of semiconductivity which in the case of a p-type substrate is preferably n-type as the junction formed between the epitaxial n-type layer 12 and the p-type substrate 10 creates a higher degree of electrical isolation through the device than if the epitaxial layer and the substrate are of the same semiconductivity type. The epitaxial layer 12 has an exposed planar surface 13.

If for any reason it is desired to employ a structure wherein the epitaxial layer and the substrate are of the same semiconductivity type, electrical isolation through the substrate would require that it be of high resistivity such as in excess of 100 ohm centimeters.

The thickness of the epitaxial layer 12 need only be sufficient to permit a double diffused structure to be formed therein and for this purpose, a thickness of about 0.3 mil to about 0.5 mil is sufficient. The resistivity of the epitaxial layer 12 may be varied within a wide range but it is desirable that at least the upper portion thereof have a suitable resistivity for the formation of a diffused transistor collector junction therein. A resistivity within the range of about 0.1 ohm-centimeter to about 10 ohm-centimeters is suitable.

It is, furthermore, possible to employ multiple epitaxial layers or a single epitaxial layer having a graded impurity concentration so as to achieve the advantages of a low collector resistance and a good collector junction in accordance with the teachings of copending application Serial No. 193,452, filed May 9, 1962, by H. C. Lin and assigned to the assignee of the present invention.

Figure 3:
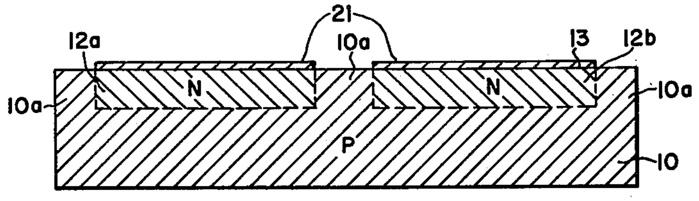

FIG. 3 shows the structure after an oxide diffusion mask 21 has been formed on the major surface 13 of the epitaxial layer 12. Any of the known techniques for the formation of an oxide diffusion mask on silicon may be employed such as thermally oxidizing the surface and selectively removing portions of the oxide layer by photo-resist masking and etching techniques. The pattern in which the oxide mask is disposed is one which permits the formation of two discrete portions **12*a* and 12*b* of the epitaxial layer upon the diffusion of an acceptor type impurity, such as boron, into the exposed surface 13 so that isolation walls 10a extend from the original substrate 10 to the surface 13. Well known techniques for impurity diffusion are suitable for this purpose and since the isolation walls 10a are not themselves used in the formation of active devices, the surface concentration to which they are diffused is not critical so long as the concentration of donor impurity atoms in the epitaxial layer 12** is overcome. Surface concentrations of the order of about $10^{20}$ atoms per cubic centimeter are suitable for this purpose and may be efficiently produced.

The structure of FIG. 3 includes two like regions **12*a* and 12*b* of semiconductive material for device formation on a passive substrate 10. Techniques other than those just described may be employed to provide this structure. The subsequent operations whereby a p-n-p transistor structure and an n-p-n transistor structure are formed in the two regions 12*a* and 12*b***, employing only two diffusion operations in accordance with this invention, will now be described.

Figure 4:
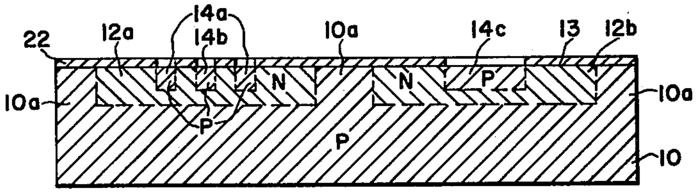

Referring to FIG. 4, by similar techniques as those employed for layer 21, another oxide diffusion mask 22 is formed with openings therein to permit the diffusion of an acceptor type impurity into selected portions of the two epitaxial regions **12*a* and 12*b* to provide in the lefthand portion 12*a* a p-type ring 14*a* enclosing a p-type dot 14*b* and in the right-hand portion 12*b* a circular p-type region 14*c*. Each of the p-type regions 14*a*, 14*b* and 14*c* form p-n junctions with the n-type epitaxial material. This diffusion operation is the only one in the practice of this invention that requires careful control since the p-type region 14*c* in the right-hand portion forms the collector junction of the n-p-n transistor and, hence, its impurity concentration should be about two orders of magnitude greater than that of the epitaxial layer in which the junction is formed. Consequently, where the epitaxial layer 12 has an impurity concentration of about $10^{15}$ atoms per cubic centimeter, the p-type diffusion may be carried out to achieve a surface concentration of about $5\times10^{17}$ atoms per cubic centimeter to about $5\times10^{18}$ atoms per cubic centimeter. Also since the depth of the p-type region 14*c*** in the right-hand portion determines to some extent the base width of the n-p-n transistor, this diffusion is carried out to a depth in the range of from about 0.1 mil to about 0.18 mil.

The diffusion parameters selected for the p-type region **14*c* in the right-hand portion are also suitable for the simultaneous diffusion of two regions 14*a* and 14*b*** in the left-hand portion which serve as the emitter and collector regions of the p-n-p transistor.

The left-hand portion of the device hence is now a three region transistor structure. The ring type configuration for the collector **14*a*** is selected in order to achieve uniformity of the base width. However, this is not a critical consideration and other configurations may be employed including simply two adjacent regions of p-type material to serve as emitter and collector.

Figure 5:
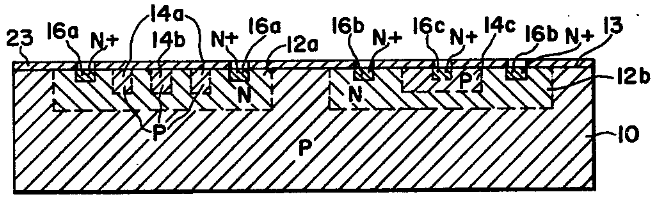

In FIG. 5, the final diffusion operation is illustrated wherein a third oxide mask 23 is formed on the surface 13 with openings provided therein to permit the introduction of donor type impurities to form three n+ regions **16*a*, 16*b* and 16*c* for the emitter of the n-p-n transistor and also for a collector contact in the n-p-n transistor and a base contact in the p-n-p transistor. These latter regions are desirable to readily permit the formation of ohmic contacts thereto with a metal such as aluminum which, if deposited on less highly doped n-type material, usually forms a rectifying contact. The surface concentration of the n+ regions 16*a*, 16*b* and 16*c*** is typically in excess of $10^{20}$ atoms per cubic centimeter.

Figure 6:
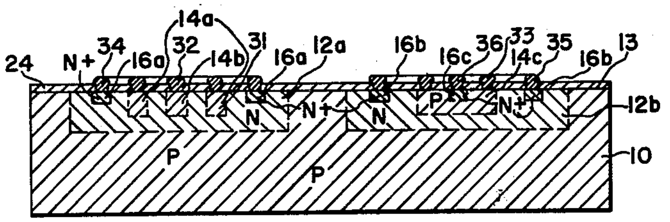

In FIG. 6, the structure fabricated by the previous operations is shown with contacts 31, 32, 33 34, 35 and 36 applied to each of the regions 14*a*, 14*b*, 14*c*, 16*a*, 16*b* and 16*c*, respectively. The contacts may be formed by the deposition of conductive material through an oxide mask 24 which serves to protect the p-n junctions on the surface 13.

Figure 7:
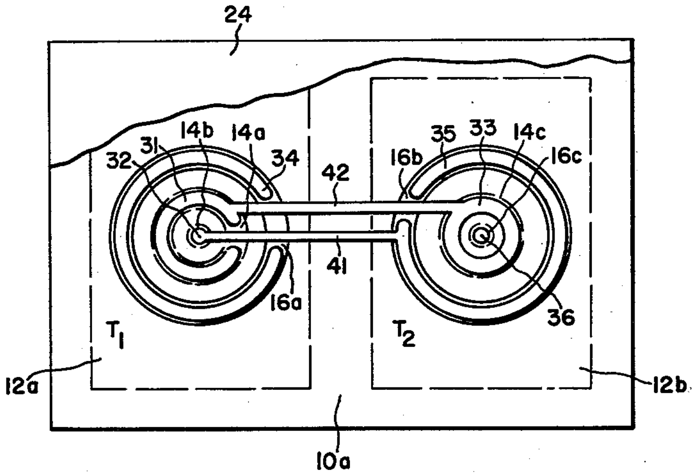
FIG. 7 is a plan view of a semiconductor structure with conductive interconnections in accordance with this invention.

In FIG. 7 a device is shown to illustrate the geometrical configuration of the regions and the conductive interconnections therebetween. The contacts 31 through 36 illustrated in FIG. 6 are shown in FIG. 7. However, in order to illustrate the geometrical configuration, only a portion of the protective oxide layer 24 is shown. Conductive interconnections 41 and 42, respectively, are shown in FIG. 7 between the emitter contact 32 of the p-n-p- transistor and the collector contact 35 of the n-p-n transistor and between the collector contact 31 of the p-n-p transistor and the base contact 33 of the n-p-n transistor. The conductive interconnections 41 and 42 may be formed at the same time as are the contacts 31 through 36 but are insulated from the semiconductive material by the oxide layer 24.

As an alternative to use of a common conductor 41 between the emitter contact 32 of $T_1$ and the collector contact 35 of $T_2$, these contacts may be maintained at different potentials during operation by a bias potential source connected therebetween. The bias potential source would supply a voltage approximately equal to the forward voltage drop of the emitter junction of $T_2$ so as to eliminate the offset in the output current-voltage characteristic which would otherwise result. This voltage is equal to about 0.6 volt for silicon. The bias potential source would be connected with a polarity to forward bias the emitter junction of $T_1$.

Leads (not shown) are attached to the contacts on the base region of the p-n-p- transistor, the emitter region of the n-p-n transistor and the collector region of the n-p-n transistor. Wire leads may be employed or conductive layers extending over the oxide layer 24 to the periphery of the device or to other functional areas of an integrated circuit may be used.

Figure 8:
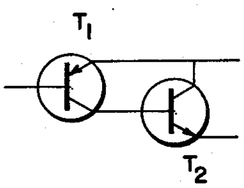
FIG. 8 is a schematic diagram of the equivalent circuit of the device of FIGS. 1–7.

The result is a device providing a complementary pair of transistors interconnected as shown in the equivalent circuit of FIG. 8. The configuration provides a p-n-p transistor $T_1$, whose collector current is amplified by an n-p-n transistor $T_2$ or where the semiconductivity types of the regions are reversed, an n-p-n transistor whose collector current is amplified by a p-n-p transistor.

In most applications, the entire structure shown in FIG. 7 will be utilized as a p-n-p transistor since $T_1$ alone will not provide sufficient amplification. Hence, an additional n-p-n transistor structure is provided in the structure for complementary amplification.

Figure 9:
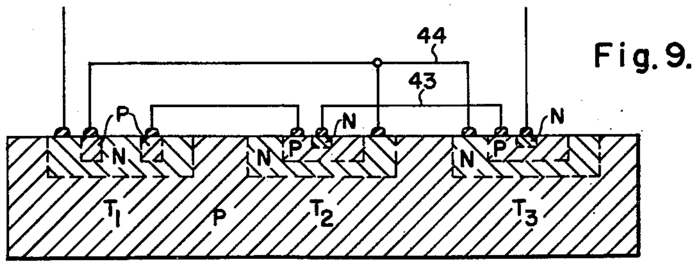
FIG. 9 is a side view, in cross section, of a semi-conductor structure further illustrating the present invention.

In FIG. 9, for example, is shown a structure including three transistor structures $T_1$, $T_2$ and $T_3$ of which $T_1$ and $T_2$ are as illustrated in the previous figures and $T_3$ has a semiconductor structure like that of $T_2$. The interconnections between $T_1$ and $T_2$ are also like those shown in FIG. 7 and, hence, $T_1$ and $T_2$ together provide the functions of a p-n-p transistor with good amplification. The interconnections between $T_2$ and $T_3$ are representative of the interconnections between a complementary pair of amplifiers with the emitter of $T_2$ connected to the base of $T_3$ by interconnection 43 and the collector of $T_2$ connected to the collector of $T_3$ by interconnection 44.

Figure 10:
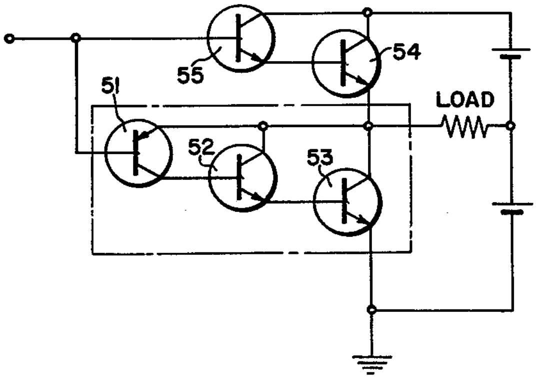
FIG. 10 is a schematic diagram of a circuit wherein devices in accordance with this invention may be used advantageously.

Circuits employing the combination shown include that of FIG. 10 where that portion of the circuit enclosed within the dotted line including the p-n-p transistor 51 and the n-p-n transistors 52 and 53 may be provided by an integrated semi-conductor device like that of FIG. 9 where the functions of transistors 51, 52 and 53 are provided by transistors $T_1$, $T_2$ and $T_3$ respectively. Each of the n-p-n transistors 52, 53, 54 and 55 may be alike and formed at the same time. It should be noted that within the practice of this invention, the number of transistor structures of each type provided is not limited since a plurality of structures can be simultaneously formed by the epitaxial and diffusion operations. It is preferred that a relatively large number of structures be simultaneously fabricated on a semiconductor wafer which then is subsequently subdivided to achieve the single devices desired which each include the desired number of transistor structures for a particular circuit function.

The circuit of FIG. 10 is suitable for a class B audio-amplifier with the p-n-p transistor providing the function of a phase inverter. This known circuit is more fully described in an article entitled "Quasi-Complementary Transistor Amplifier," by H. C. Lin appearing in Electronics, v. 29, pages 173–175 (September 1956).

It will be noted that the complementary transistor structure in accordance with this invention may be a part of an integrated circuit which includes regions for the performance of the functions of devices other than transistors such as diodes, resistors and capacitors which may be fabricated within the structure by known techniques, in the same diffusion operations by which the transistor structures are formed.

There will now be described a specific example, by way of further illustration, of the fabrication of a device in accordance with this invention with reference again to FIGS. 1 to 7.

The starting material 10 was a body of p-type monocrystalline silicon having a substantially uniform resistivity of about 20 ohm centimeters and a thickness of about 8 mils. The substrate had a surface of <111> orientation. The surface was degreased and chemically etched by conventional techniques and heated in a hydrogen atmophere to a temperature of about 1250 to 1300° C. for about ten minutes to remove oxide from the surface.

Then the body of material 10, along with others being similarly fabricated, was placed on a support including a block of graphite with a quartz plate thereon. The semiconductor bodies and the support were placed within an open ended quartz tube and the reactants for the epitaxial deposition of silicon thereon were supplied to the tube while heating the graphite block, and hence the silicon substrate, to a temperature of about 1200° C. by induction heating. Hydrogen was supplied at a typical flow rate of about 20 liters per minute. Hydrogen bubbled through a solution of phosphorus trichloride in silicon tetrachloride, at a temperature of 0° C., was supplied at a typical flow rate of about 300 cubic centimeters per minute. Under these conditions, epitaxial growth at a rate of about 0.02 mil per minute was achieved with a doping concentration of about $10^{15}$ atoms per cubic centimeter. Growth was continued until a layer of about 0.4 mil thickness was achieved. Some variation in the flow rates of reactants may be necessary to achieve a layer having the desired resistivity depending upon the furnace geometry.

An alternative method of epitaxial growth which has been successfully employed in the fabrication of devices in accordance with this invention is that in which phosphene, $PH_3$, is used to provide the doping impurity. The phosphene is mixed with hydrogen at a concentration of about 50 parts per million. The silicon tetrachloride is supplied from a separate source to the reaction chamber.

For the formation of the oxide layers 21, 22, 23 and 24 employed as diffusion masks and as a passivating layer in the final device, the wafer was subjected to a temperature of about 1100° C. to about 1200° C. for a few minutes in the presence of oxygen and water vapor. Standard photo-resist techniques were used to provide the desired openings in the oxide layers.

For the diffusion of the p-type isolation walls 10*a*, a borosilicate glass diffusion source was prepared by sprinkling boric acid on a quartz plate and firing it at about 950° C. for about 3 hours. The silicon slices to be diffused were placed on a quartz plate within a quartz tube. The borosilicate glass was also placed in the quartz tube with the doped surface facing the silicon wafers. Nitrogen was used as the carrier gas at a flow rate of from about 100 cubic centimeters per minute to about 1 liter per minute. Deposition of the boron impurity onto the silicon was achieved by heating the tube to a temperature of about 950° C. for about 30 minutes after which the diffusion source was removed from the tube. Then diffusion of boron through the epitaxial layer 12 was achieved by heating to a temperature of about 1200° C. to about 1250° C. for about 4 hours providing a final surface concentration of about $10^{20}$ atoms per cubic centimeter.

For the diffusion of the p-type regions 14*a*, 14*b* and 14*c* the impurity deposition and diffusion operations were performed substantially the same way as for the isolation walls 10*a* but with shorter times employed. That is, the deposition was performed at about 950° C. for about 10 or 20 minutes and the diffusion was performed at about 1200° C. for about 2 hours achieving a surface concentration of about $10^{18}$ atoms per cubic centimeter and a depth of about 0.12 mil to 0.16 mil.

For the diffusion of the n+ regions 16*a*, 16*b* and 16*c*, phosphorus oxychloride, $POCl_3$, was used as the source of impurity atoms. To the quartz tube containing the silicon slices to be diffused were supplied pure nitrogen at about 500 cubic centimeters per minute, oxygen at about 100 cubic centimeters per minute and nitrogen which has been passed over $POCl_3$ (a liquid room temperature) at about 20 to 50 cubic centimeters per minute. The vapors were supplied for about 20 minutes with the tube at about 1140° C. to deposit the phosphorus impurity on the silicon surface. Then the diffusion was performed by heating to a temperature of from about 1050° C. to about 1100° C. for obout 10 to 40 minutes to provide a surface concentration of about $5\times10^{20}$ atoms per cubic centimeter to about $10^{21}$ atoms per cubic centimeter and a diffused depth of about 0.08 to 0.10 mil.

For the formation of the contacts 31, 32, 33, 34, 35 and 36 and the conductive interconnections 41 and 42, aluminum was deposited by evaporation onto the oxide layer 24, which had openings for the contacts 31 through 36. The aluminum was etched away except where desired by conventional photoresist and etching techniques and the structure heated to about 600° C. to 610° C. for about 1 minute to alloy the aluminum contacts.

While the present invention has been shown and described in a few forms only, it will be apparent that various changes and modifications may be made without departing from the spirit and scope thereof.

I claim as my invention:

1. A semiconductor structure comprising: a unitary body of semiconductive material including a substrate; first and second separate semiconductive regions of a first type of semiconductivity on said substrate; third and fourth semiconductive regions of a second type of semiconductivity disposed in p-n junction forming relationship with said first region on the surface thereof remote from said substrate and forming a first sub-structure operable as a first transistor wherein said first region serves as the base region and said third and fourth regions serve as emitter and collector regions; a fifth semiconductive region of said second type of semiconductivity disposed in p-n junction forming relationship with said second region; and a sixth semiconductive region of said first type of semiconductivity disposed in p-n junction forming relationship with said fifth region and forming a second sub-structure operable as a second transistor of opposite polarity to that of said first transistor wherein said second region serves as the collector region, said fifth region serves as the base region and said sixth region serves as the emitter region.

2. A semiconductor structure in accordance with claim 1 wherein said first and second regions have the same thickness and impurity concentration; and said third, fourth and fifth regions have the same thickness and impurity concentration.

3. A semiconductor device structure comprising; a unitary body of semiconductive material including a substrate of a first type of semiconductivity; said substrate having a planar surface; first and second semiconductive regions of a second type of semiconductivity disposed within said planar surface and each forming a p-n junction with said substrate which terminates at said surface; third and fourth semiconductive regions of said first type of semiconductivity disposed in said first region and each forming a p-n junction therewith which terminates at said surface to provide a first transistor structure wherein said first region serves as the base region and said third and fourth regions serve as emitter and collector regions; a fifth semiconductive region of said first type of semiconductivity disposed in said second region and forming a p-n junction therewith terminating at said surface; a sixth semiconductive region of said second type of semiconductivity disposed in said fifth region and forming a p-n junction therewith terminating at said surface to provide a second transistor structure of opposite polarity to that of said first transistor structure wherein said second region serves as the collector region; said fifth region serves as the base region and said sixth region serves as the emitter region; an electrical contact disposed on each of said emitter, base and collector regions of said first and second transistor structures; a first conductive inter-connection between said emitter of said first transistor structure and said collector of said second transistor structure; and a second conductive interconnection between said collector of said first transistor structure and said base of said second transistor.

4. A semiconductor device structure in accordance with claim 3 wherein a passivating oxide layer is disposed on said surface except where said contacts are disposed; said first conductive interconnection extends over said oxide layer and forms a conductive path between the contact to said emitter region of said first ransistor structure and the contact to said collector of said second transistor structure and said second conductive interconnection extends over said oxide layer and forms a conductive path between the contact to said collector of said first transistor structure and the contact to said base of said second transistor structure.

5. A semiconductor device structure in accordance with claim 3 wherein: said unitary body of semiconductive material is of silicon; said first, second and sixth semiconductive regions are of n-type semiconductivity; and said third, fourth and fifth regions and said substrate are of p-type semiconductivity.

6. A semiconductor device structure in accordance with claim 3 further comprising: a seventh semiconductive region of said second type of semiconductivity disposed within said planar surface and forming a p-n junction with said substrate which terminates at said surface; an eighth semiconductive region of said first type of semiconductivity disposed in said seventh region and forming a p-n junction therewith terminating at said surface; a ninth semiconductive region of said second type of semiconductivity disposed in said eighth region and forming a p-n junction therewith terminating at said surface to provide a third transistor structure of the same polarity as said second transistor structure wherein said seventh region serves as the collector region, said eighth region serves as the base region and said ninth region serves as the emitter region; an electrical contact disposed on each of said emitter, base and collector regions; and conductive interconnections between selected regions of said first and second transistor structures and selected regions of said third transistor structure to form an integrated device for providing the functions of two complementary transistor amplifiers having appreciable gain.

7. A semiconductor structure capable of performing the functions of a complementary pair of transistors in a single body of material which may also include other elements of an integrated circuit, said structure comprising: a substrate; a first transistor structure including a base region and emitter and collector regions laterally positioned in said base region; a second and a third transistor structure each including transversely positioned interconnections between selected regions of said first and structure being of opposite polarity to said second and third transistor structures; and means to electrically interconnect said first, second and third transistor structures.

8. A semiconductor structure in accordance with claim 7 wherein: the base region of said first transistor structure and the collector regions of each of said second and third transistor structures have the same thickness and impurity concentration; the emitter and collector regions of said first transistor structure and the base regions of said second and third transistor structures have the same thickness and impurity concentration.

References Cited by the Examiner

UNITED STATES PATENTS

| | | | |
|---|---|---|---|
| 2,994,834 | 8/61 | Jones | 330—39 |
| 3,063,129 | 11/62 | Thomas | 29—25.3 |
| 3,089,219 | 5/63 | Williams | 29—25.3 |
| 3,103,599 | 9/63 | Henkels. | |
| 3,142,021 | 7/64 | Stelmak | 330—39 |

FOREIGN PATENTS

| | | |
|---|---|---|
| 650,779 | 10/62 | Canada. |

ROY LAKE, *Primary Examiner.*

NATHAN KAUFMAN, *Examiner.*

UNITED STATES PATENT OFFICE

CERTIFICATE OF CORRECTION

Patent No. 3,197,710 July 27, 1965

Hung Chang Lin

It is certified that error appears in the above identified patent and that said Letters Patent are hereby corrected as shown below:

Column 9, line 9, "interconnections between selected regions of said first and" should read -- emitter, base and collector regions; said first transistor --.

Signed and sealed this 13th day of January 1970.

(SEAL)
Attest:

Edward M. Fletcher, Jr.
Attesting Officer

WILLIAM E. SCHUYLER, JR.
Commissioner of Patents